US010003676B2

(12) United States Patent
Tran et al.

(10) Patent No.: US 10,003,676 B2
(45) Date of Patent: Jun. 19, 2018

(54) METHOD AND APPARATUS FOR GENERATING PARALLEL LOOKUP REQUESTS UTILIZING A SUPER KEY

(71) Applicant: Cavium, Inc., San Jose, CA (US)

(72) Inventors: Anh Tran, Santa Clara, CA (US); Tsahi Daniel, Palo Alto, CA (US); Gerald Schmidt, San Jose, CA (US)

(73) Assignee: Cavium, Inc., San Jose, CA (US)

(*) Notice: Subject to any disclaimer, the term of this patent is extended or adjusted under 35 U.S.C. 154(b) by 448 days.

(21) Appl. No.: 14/628,058

(22) Filed: Feb. 20, 2015

(65) Prior Publication Data
US 2016/0246882 A1  Aug. 25, 2016

(51) Int. Cl.
*G06F 17/30* (2006.01)
*H04L 29/06* (2006.01)
*G11C 15/00* (2006.01)
*H04L 12/773* (2013.01)

(52) U.S. Cl.
CPC .............. *H04L 69/22* (2013.01); *G11C 15/00* (2013.01); *H04L 45/60* (2013.01)

(58) Field of Classification Search
None
See application file for complete search history.

(56) References Cited

U.S. PATENT DOCUMENTS

| | | | | |
|---|---|---|---|---|
| 4,929,939 A * | 5/1990 | Varma | ............... | G06F 15/17375 340/2.24 |
| 5,319,347 A * | 6/1994 | McClure | ................ | G06F 7/026 327/77 |
| 8,553,686 B2 | 10/2013 | Smith | | |
| 9,159,420 B1 * | 10/2015 | Wohlgemuth | ......... | G11C 15/04 |
| 9,264,357 B2 * | 2/2016 | Wang | .................... | H04L 45/745 |
| 9,269,439 B1 * | 2/2016 | Levy | ....................... | G11C 15/00 |
| 9,319,336 B2 * | 4/2016 | Thakkar | .................. | H04L 47/50 |

(Continued)

OTHER PUBLICATIONS

Bosshart, Pat, Glen Gibb, Hun-Seok Kim, George Varghese, Nick McKeown, Martin Izzard, Fernando Mujica, and Mark Horowitz. "Forwarding metamorphosis: Fast programmable match-action processing in hardware for SDN." in ACM SIGCOMM Computer Communication Review, vol. 43, No. 4, pp. 99-110. ACM, 2013.*

(Continued)

*Primary Examiner* — Farhan Syed

(57) ABSTRACT

The invention describes a network lookup engine for generating parallel network lookup requests for input packets, where each packet header is parsed and represented by a programmable parser in a format, namely a token, which is understandable by the engine. Each token can require multiple lookups in parallel in order to speed up the packet processing time. The sizes of lookup keys varies depending on the content of the input token and the protocols programmed for the engine. The engine generates a super key per token, representing all parallel lookup keys wherein content of each key can be extracted from the super key through an associated profile identification. The network lookup engine is protocol-independent which means the conditions and rules for generating super keys are full programmable so that the engine can be reprogrammed to perform a wide variety of network features and protocols in a software-defined networking (SDN) system.

31 Claims, 12 Drawing Sheets

(56) References Cited

U.S. PATENT DOCUMENTS

| | | | | |
|---|---|---|---|---|
| 9,379,963 B2* | 6/2016 | Tran | ............... | H04L 45/74 |
| 2002/0009076 A1* | 1/2002 | Engbersen | .......... | H04L 45/7457 |
| | | | | 370/389 |
| 2014/0241353 A1* | 8/2014 | Zhang | ............... | H04L 45/74 |
| | | | | 370/390 |
| 2014/0321467 A1* | 10/2014 | Wang | ............... | H04L 45/745 |
| | | | | 370/392 |
| 2014/0369363 A1* | 12/2014 | Hutchison | ............ | H04L 45/745 |
| | | | | 370/474 |
| 2015/0156288 A1* | 6/2015 | Lu | ............... | H04L 69/22 |
| | | | | 370/392 |
| 2015/0186143 A1* | 7/2015 | Tran | ............... | G06F 9/30145 |
| | | | | 712/225 |
| 2015/0186516 A1* | 7/2015 | Tran | ............... | H04L 45/74 |
| | | | | 707/706 |
| 2016/0197852 A1* | 7/2016 | Hutchison | ............ | H04L 49/109 |
| | | | | 370/392 |
| 2016/0277295 A1* | 9/2016 | Tran | ............... | H04L 45/74 |

OTHER PUBLICATIONS

Price, Charles. "MIPS IV instruction set." (1995), Revision 3.2, MIPS, pp. A1-B-127 (328 total pages).*
Altera, "White Paper," Jul. 2006, pp. 1-9.*

* cited by examiner

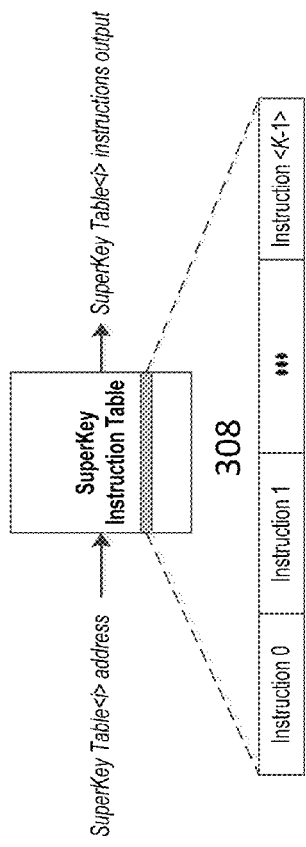
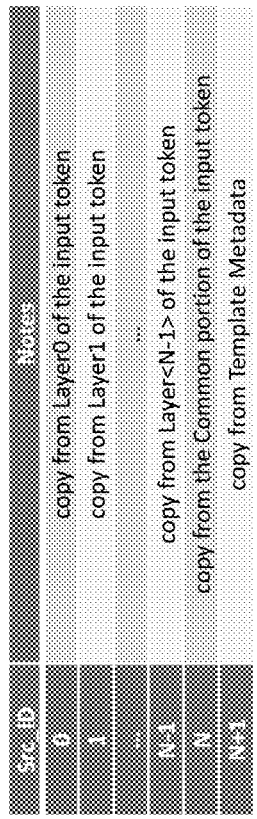
FIG. 7A
FIG. 7B
FIG. 7C

METHOD AND APPARATUS FOR GENERATING PARALLEL LOOKUP REQUESTS UTILIZING A SUPER KEY

TECHNICAL FIELD

The present invention relates to programmable engine architectures for generating lookup keys for network packets. The present invention also relates to generation of parallel lookup keys with variable sizes for network packets. More specifically, the invention relates to programmable engine architectures in a software-defined networking system, which allows the users to program the engines so that each engine generates a lookup super key representing multiple parallel varying-size lookup keys per network packet.

BACKGROUND

Traditionally, networking features and protocols in network devices have been implemented by hardware-dedicated ASIC designs. These fixed ASIC designs limit the rate of deployment of new protocols. In addition, the hardware changes to support new protocols are expensive in term of both cost and time. As a result, designs of programmable networking devices, which allow users to deploy new features and protocols by means of software have been becoming more attractive.

One approach to programmable networking devices is to implement the protocols in software running on state-of-the-art general-purpose CPUs. The processing capacity at maximum of 64 bits of state-of-the-art general-purpose CPUs, however, cannot guarantee real-time performance for current networking systems, which support network packet flows up to hundreds of Gbps.

Alternatively, reconfigurable FPGA chips have been also used to implement network features in programmable network devices. Their limitations in logic cell capacity of the FPGA chips, however, do not allow them to process network packets with large sizes of hundreds of bytes at line-rate throughput. In addition, the high complexity in their internal interconnect wirings makes the FPGA chips running at low frequency with high latency, which are not appropriate for complex network features required in new enterprise and data-center networks.

In practical networks, each packet often encapsulates many header fields representing different protocol stacks, for non-limiting examples, Ethernet, VLAN, MPLS, IP, TCP, HTTP, and so on. More protocols have been added recently such as NVGRE, VxLAN and STT, and more will be added in the future. In addition, the packet header also needs to support different non-standard customer-specific protocols. As such, it is common for a packet to have eight or more different header fields during the time it travels on the network.

In order for the engines to be able to correctly process the network packets, each header of these packets is parsed by a Parser in the system. The outputs of the Parser are "tokens", wherein one token is generated per packet and has a predefined format so the engines can understand and process the token.

The foregoing examples of the related art and limitations related therewith are intended to be illustrative and not exclusive. Other limitations of the related art will become apparent upon a reading of the specification and a study of the drawings.

BRIEF DESCRIPTION OF THE DRAWINGS

Aspects of the present disclosure are best understood from the following detailed description when read with the accompanying figures in which like reference characters refer to the same parts throughout the different views. It is noted that, in accordance with the standard practice in the industry, various features are not drawn to scale and emphasis instead being placed upon illustrating embodiments of the present invention. In fact, the dimensions of the various features may be arbitrarily increased or reduced for clarity of discussion. The scope of the present patent application is not limited to the disclosed embodiments, but also encompasses combinations of the disclosed embodiments, as well as modifications to the disclosed embodiments.

FIG. 7A is an example of a block diagram of the Super-Key Table and the content of each memory entry according to an embodiment of the present invention.

FIG. 7B shows an example of the format of a SuperKey instruction according to an embodiment of the present invention.

FIG. 7C is an example of a table listing the input data sources used by SuperKey instructions according to an embodiment of the present invention.

DETAILED DESCRIPTION

Figure 1:
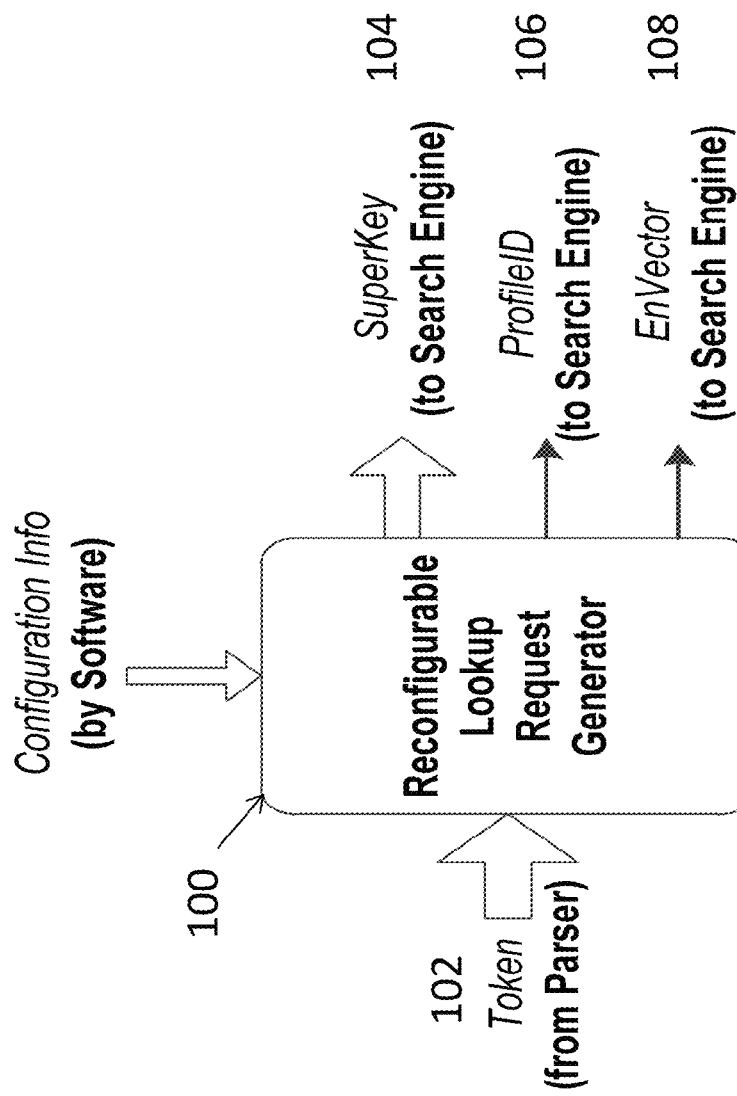
FIG. 1 is an example of a block diagram showing the proposed primary interfaces of the programmable lookup request generation engine according to an embodiment of the present invention.

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

A new programmable network lookup engine architecture is proposed, which allow the users to configure the engine to generate a super lookup key representing multiple parallel varying-size lookup keys per token. Specifically, the network lookup engine is configured to generate a plurality of parallel network lookup requests for each network packet, wherein the header of each packet is parsed and represented by a programmable Parser in a format, namely a token understandable by the network lookup engine.

In some embodiments, each token can require multiple lookups in parallel in order to speed up the packet processing time. The sizes of the lookup keys vary, depending on the content of the input token and the protocols programmed for the engine. The network lookup engine is configured to generate a super key per token, representing all of the parallel lookup keys, wherein content of each of the lookup keys can be extracted from the super key through an associated profile identification.

Under the proposed approach, the proposed network lookup engine is able to perform multiple lookups in parallel, which speeds up the overall packet processing time of a software-defined network system. The lookup keys generated by the proposed network lookup engine can be in large sizes, for a non-liming example, of hundreds of bytes. In addition, the proposed engine is protocol-independent, meaning that the conditions and rules for generating super keys are full programmable by software depending on the network features and protocols configured for the engine so that the engine can be reprogrammed to perform a wide variety of network features and protocols in any software-defined networking (SDN) system.

As referred to hereinafter, an engine includes a computing unit and software instructions that are stored in a storage unit of the computing unit for practicing one or more processes. When the software instructions are executed, at least a subset of the software instructions is loaded into memory (also referred to as primary memory) by the computing unit, the computing unit becomes a special purpose for practicing the processes. The processes may also be at least partially embodied in the computing unit into which computer program code is loaded and/or executed, such that, the computing unit becomes a special purpose computing unit for practicing the processes.

FIG. 1 is an example of a block diagram showing the primary input and output interfaces of the network lookup engine 100 (reconfigurable lookup request generator) 100. Although the diagrams depict components as functionally separate, such depiction is merely for illustrative purposes. It will be apparent that the components portrayed in this figure can be arbitrarily combined or divided into separate software, firmware and/or hardware components.

In the example of FIG. 1, the network lookup engine 100 is configured to receive tokens 102 from an external Parser (not shown), where the header fields of each network packet were parsed. For each of the network packet, the Parser sends out a token 102, which has a predefined format so that the engine 100 can understand (the format of tokens will be described in FIG. 4A).

For each input token 102, the network lookup engine 100 is configured to generate multiple parallel lookup keys to a Search Engine (not shown). Here, the Search Engine is a remote engine, which receives the lookup keys from one or more of the network lookup engines 100 and returns sometime later the lookup data for each lookup key. Because the number of lookup keys and the size of each key vary token by token, the engine 100 is configured to only send one SuperKey 104 which represents for multiple parallel keys instead of using multiple signals for sending multiple keys to the Search Engine.

In some embodiments, the network lookup engine 100 is also configured to send a ProfileID 106 and an EnVector 108 along with the SuperKey 104 to the Search Engine in order for the Search Engine to be able to properly extract individual lookup keys from the SuperKey 104. Here, the ProfileID 106 contains the information on: 1) how many individual keys are packed in the associated SuperKey 104; 2) which data portion in the SuperKey 104 becomes the content of each individual key; 3) which lookup table in the Search Engine will be used for each key (assuming the Search Engine has a large number of lookup tables). The EnVector 108 includes information on which keys in the individual keys extracted by the Search Engine from the SuperKey 104 are valid for performing the lookups (so that Search Engine would not perform lookups for invalid keys to save power and reduce latency).

Figure 2:
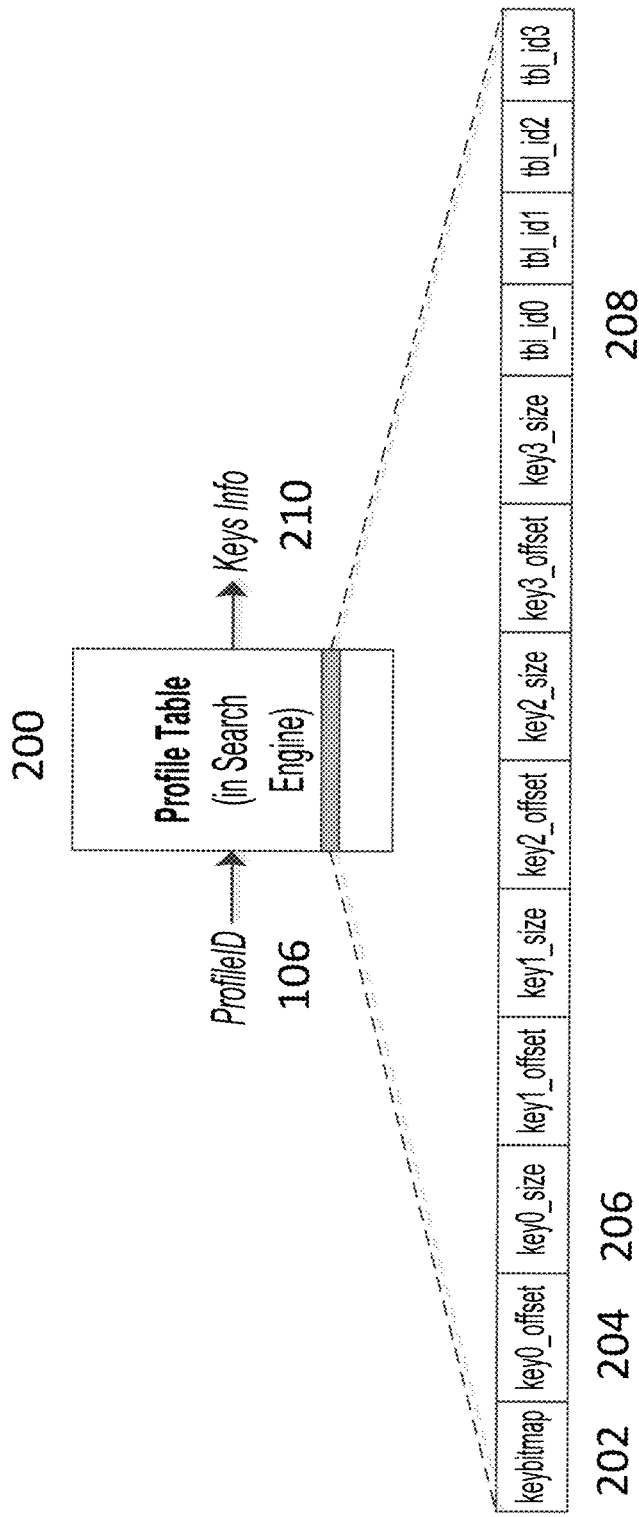
FIG. 2 illustrates an example of a ProfileID table in the Search Engine according to an embodiment of the present invention.

FIG. 2 depicts a non-limiting example of a ProfileID table 200 inside the Search Engine. In this non-limiting example, it is assumed that a SuperKey 104 supports up to 4 individual keys. The table uses ProfileID 106 as its table address, then returns a memory data/keys info 210, which includes the following:

1) a 4-bit keybitmap 202 representing how many keys are packed in the SuperKey 104; bit '1' presents one key; up to 4 keys as assumed. For example, if keybitmap=1011(b), it means the SuperKey 104 contains 3 keys: key0, key1, key3.

2) key<i>_offset 204 and key<i>_size 206 (for i from 0 to 3) indicating the byte offset in the SuperKey 104, which is the first byte of key<i>, and the size of key<i>, respectively. For a non-limiting example, if key0_offset=5 and key0_size=8, then key0 has 8 bytes which are bytes 5th, 6th, . . . , 12th in the SuperKey 104.

3) tbl_id<i> 208 indicating which table in the Search Engine is used to perform the lookup operation for key<i>.

For a non-limiting example, if tbl_id0=14, then table 14 in the Search Engine is used to perform the lookup for key0.

In some embodiments, two different tokens 102 may have the same ProfileID 106, which means the two tokens 102 have the same number of keys and the same byte positions of keys packed in their corresponding SuperKeys 104s. If the user want to perform different number of lookups per these 2 tokens. the network lookup engine 100 is configured to be more flexible by allowing it to also send an EnVector 108 along with a SuperKey 104 and a ProfileID 106 to the Search Engine, wherein EnVector 108 provides information on which keys given by the ProfileID 106 are valid for lookup. In the same example above, if EnVector=1001(b), then only key0 and key3 are valid for lookup, even though key1 is also packed in the SuperKey 104.

Figure 3:
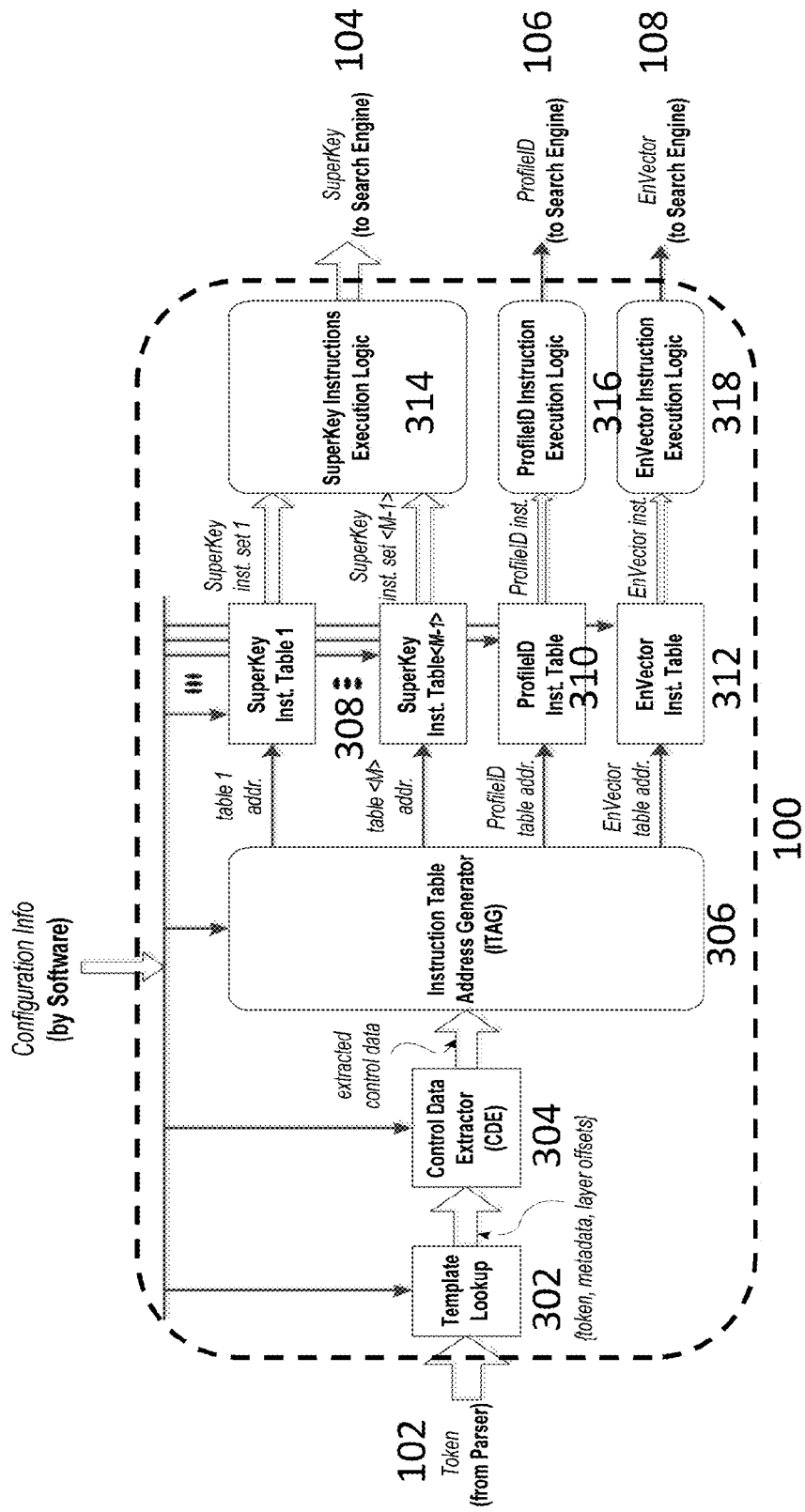
FIG. 3 is an example of a block diagram showing the overall design of the proposed lookup engine according to an embodiment of the present invention.

FIG. 3 shows an example of a block diagram showing the overall architecture of the network lookup engine 100, which includes one or more of:

1) a Template (Lookup) Table 302, which contains the format information of input tokens 102.

2) a Control Data Extractor (CDE) 304, which extracts appropriate bits from the control fields in the input token 102. These control bits are then checked and used to guide other blocks in the engine 100 to properly generate lookup requests (e.g., SuperKey 104, ProfileID 106 and EnVector 108) for each token 102.

3) an Instruction Table Address Generator (ITAG) 306, which generates the addresses for all instruction tables. The instructions table addresses generated depend on the content of the control data extracted previously (by the CDE 304) and the network protocols the user has programmed for the engine 100.

4) an array of Instruction Tables, including M SuperKey instruction tables 308, one ProfileID instruction table 310, and one EnVector instruction table 312. These instruction tables contain programmable instructions on how to build the lookup requests for each input token 102.

5) an array of hardware logic blocks for executing the instructions received from Instruction Tables, including SuperKey Instructions Execution Logic 314, ProfileID Instruction Execution Logic 316, and EnVector Instructions Execution Logic 318. The outputs of these logic blocks are the final lookup requests (e.g., SuperKey 104, ProfileID 106 and EnVector 110), which will be sent to the Search Engine.

In some embodiments, the network lookup engine 100 is protocol-independent, wherein all blocks in the engine 100 are programmable and reconfigurable by the users so that the engine 100 can support a wide range of current protocols including but not limited to Ethernet, VLAN, MPLS, IP, TCP, UDP, HTTP, NVGRE, VxLAN and STT as well as other custom-specific protocols. In some embodiments, the engine 100 is compatible with OpenFlow specification which allows programming of the SDN engines through high-level programming languages using standard APIs.

Figure 4A:
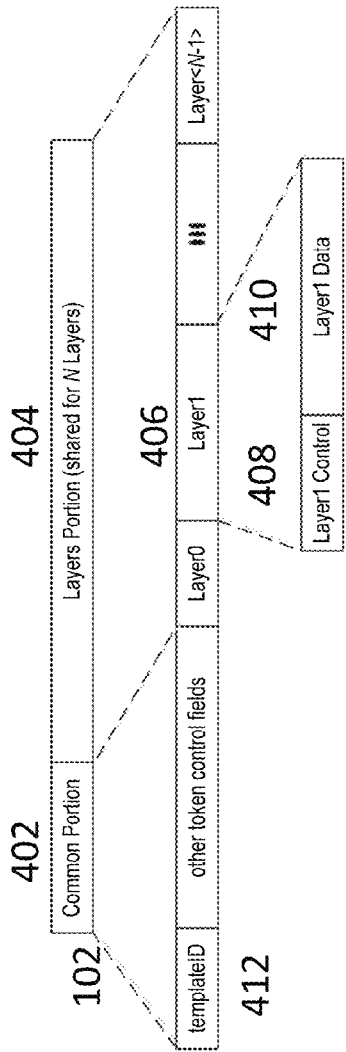
FIG. 4A shows an example of the token format according to an embodiment of the present invention.

In the example of FIG. 3, after the engine 100 receives an input token 102, the format of the token 102 is identified through looking up at the Template Lookup Table 302. In order for the engine 100 to be able to understand the content of the token 102, the format of the token 102 is agreed upon among all engines in the system. FIG. 4A shows an example of the format of the token 102, wherein the token 102 includes two main portions: Common portion 402, and Layers portion 404. The Common portion 402 contains general control bits of the corresponding network packet, which were put into the token 102 by the Parser, such as timestamp, sequence number, priority, next engine address in the SDN system on-chip, source port, packet byte count, hash select, etc. These general control fields are chosen by the designers who develop the SDN system so that these fields are useful for all engines in the system to properly manipulate the receiving packets.

The Layers portion 404 of each token 102 contains all header fields of the corresponding network packet parsed by the Parser. In practical networks, each packet may also encapsulate many header fields corresponding to the protocols supported by the network, for example: Ethernet, VLAN, MPLS, IP, TCP, HTTP etc. It is common for a packet to have eight or more different header fields during the time it travels through the network. The Parser parses these packet header fields and put those into the Layers portion 404 of the token 102. Each of the parsed packet header field has a corresponding Layer 406 inside the Layers portion of the token 102. Each layer 406 in the token 102 includes two fields: Control field 408 and Data field 410. The Control field 408 contains main control bits such as priority and protocol type, which are embedded into that layer 406 by the Parser so that the engine 100 can properly manipulate the corresponding packet header field. The Data field 410 of each layer 406 contains the rest of the information of the corresponding parsed packet header field.

Figure 4B:
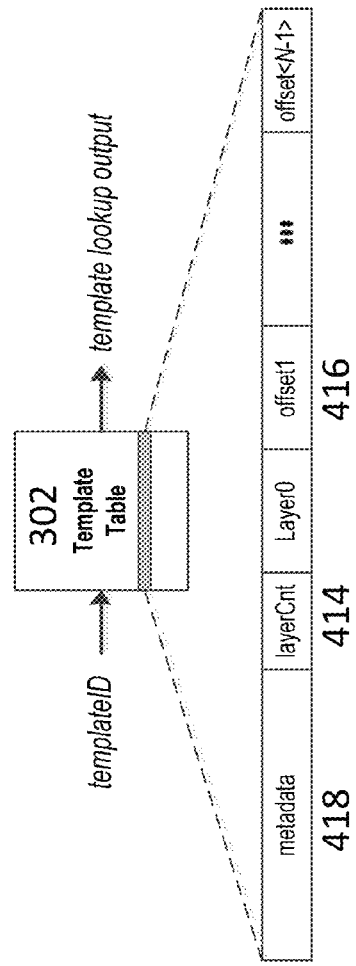
FIG. 4B is an example of a block diagram of the Template Table and the content of each memory entry according to an embodiment of the present invention.

Since each packet can have several header fields with different sizes, the Layers portion 404 inside each token 102 may also contain multiple layers with different sizes. In some embodiments, the network lookup engine 100 is configured to utilize a "templateID" field 412 inside the Common portion 402 of the token 102 for identifying the number of layers and their sizes as well as their positions inside the token 102. The "templateID" field 412 was written by the Parser while parsing the corresponding packet. The engine 102 uses the value of this "templateID" field 412 as a lookup pointer to the Template Lookup Table 302. The Template Lookup Table 302 returns the number of layers 414 packed into the Layers portion 404 and offsets 416 of these layers in the token 102 as illustrated by the example of FIG. 4B.

In some embodiments, the Template Lookup Table 302 also extracts and returns metadata bits 418 for each input token 102, which are additional control bits for the token 102 along with the control bits inside the corresponding token 102. Using the Template Lookup Table 302 reduces the token sizes because it allows putting a portion of control bits and offset information of layers into the Template Table 302 rather than being carried by the token 102 itself. Here, the Template Table 302 is programmed by the users depending on which network protocols the Parser and engines 100 in the system would support.

Figure 5:
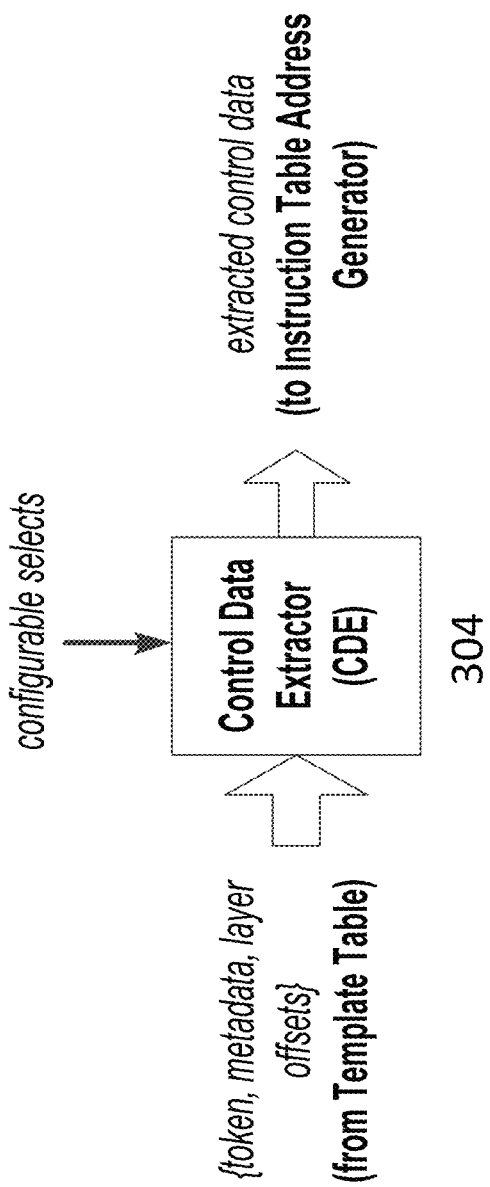
FIG. 5 is an example of a block diagram of the Control Data Extractor inside the proposed lookup engine according to an embodiment of the present invention.

FIG. 5 is an example of a block diagram of the Control Data Extractor (CDE) 304 inside the network lookup engine 100, wherein each input token and its corresponding template information from the Template Table 302 are sent to the CDE 304 for extracting the most important control bits from the input data. The extracted control bits include but are not limited to specific bits in the Common portion 402 and all control bits of layers in the Layers portion 404 of the token 102. The positions of the extracted bits in the Common portion 402 of the token 102 are reconfigured by the users depending on the network protocols they want the engine 100 to support. All metadata bits of the template lookup result are also extracted by the CDE 304.

As shown in the example of FIG. 3, all extracted data bits by the CDE 304 are fed into the Instruction Table Address Generator (ITAG) 306, which main task is to generate the addresses for instruction tables that contain instructions for building the final lookup requests for each input token 102.

The main function behind the ITAG 306 is to check whether some of the extracted control bits match with specific values given by the programmed network protocols. Based on the match checking results, ITAG 306 returns proper addresses for the instruction tables, which in turn properly generate instructions for building the final lookup keys for tokens 102.

Figure 6A:
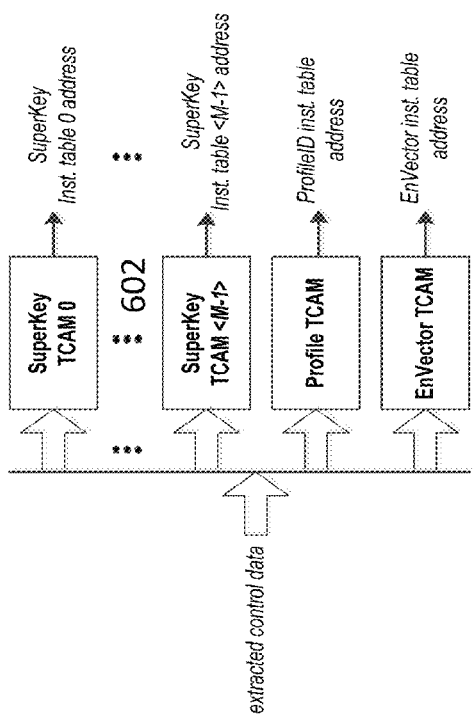
FIG. 6A shows an example of a method for generating instruction table addresses for a token using multiple TCAM modules according to an embodiment of the present invention.

FIGS. 6A-6D show four different methods for designing the ITAG 306. FIG. 6A shows an example of a method for generating instruction table addresses for a token using multiple Ternary Content-Addressable Memory (TCAM) modules 602, where each instruction table is driven by a TCAM. For the M SuperKey instruction tables 308, one ProfileID instruction table 310 and one EnVector instruction table 312, M+2 TCAMs 602 are used for the ITAG 306, wherein all of the extracted control bits are fed into these TCAMs 602s. Each TCAM 602 is configured to match the extracted control bits with its memory content and returns the matched address if there is a match. If no match is found, the default returned address is 0. The returned address by M+2 TCAMs 602s are used as pointers for M+2 instruction tables.

Figure 6B:
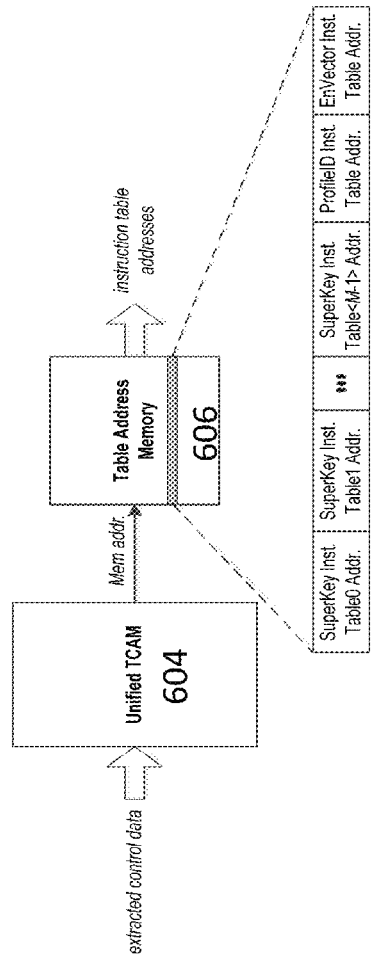
FIG. 6B shows an example of a method for generating instruction table addresses for a token using a unified TCAM and an associated table address memory according to an embodiment of the present invention.

FIG. 6B shows an example of a method for generating instruction table addresses for a token using only one TCAM 604 and an associated table address memory 606 instead of using M+2 separate TCAMs 602. Here, a unified TCAM 604 is used to match the extracted control data with pre-programmed values in its content. A matching memory address is returned by the TCAM 604 if there is any match. If no match is found, the default returned memory address is 0. The returned memory address is used to point to a Table Address Memory 606, wherein each entry of the Table Address Memory 606 contains a set of addresses for all M+2 instruction tables.

Figure 6C:
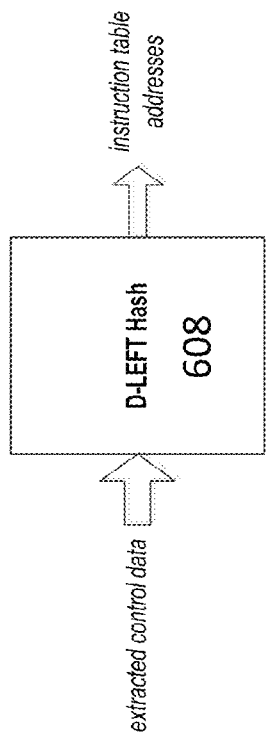
FIG. 6C shows an example of a method for generating instruction table addresses for a token using a DLEFT-based hashing according to an embodiment of the present invention.

FIG. 6C shows an example of a method for generating instruction table addresses for a token using D-LEFT based hash 608 instead of TCAM. Here, the extracted control bits are passed to multiple hash functions (in a multiple hash ways) in the D-LEFT based hash 608. The outputs of the hash functions are used as the pointers for reading matching memories. Each entry of each matching memory contains data to match with the extracted control bits. If there is any match from a memory, the matched address is in turn used to read a Table Address Memory 606. The Table Address Memory 606 then returns a set of final addresses for all M+2 instruction tables.

Figure 6D:
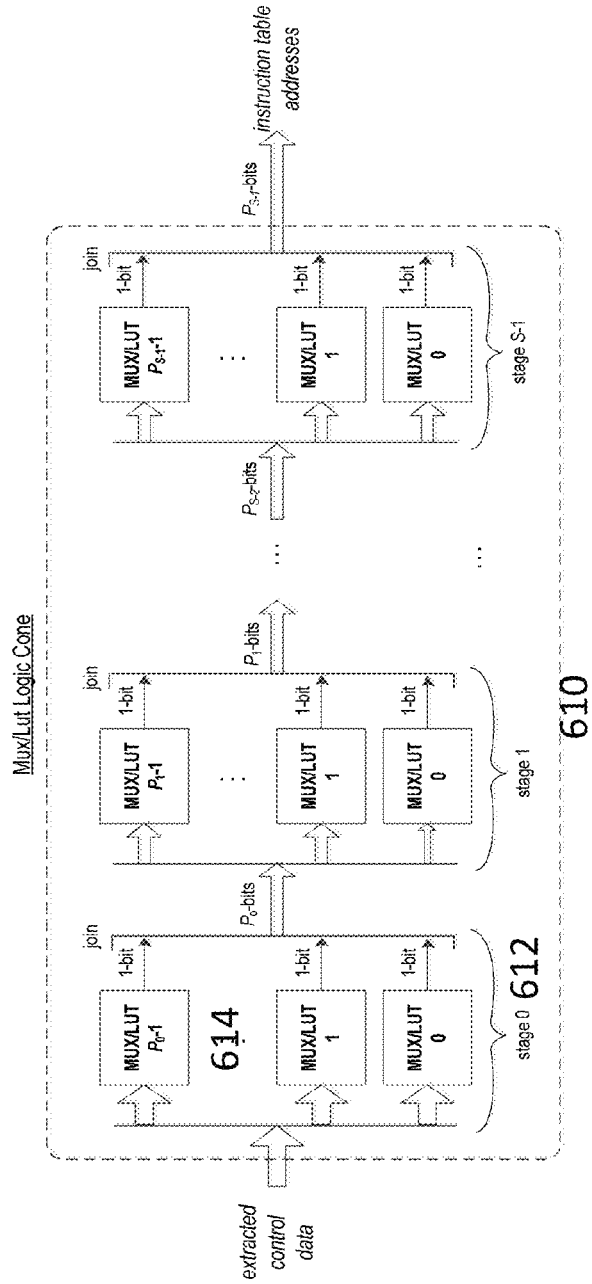
FIG. 6D shows an example of a method for generating instruction table address for a token using a multi-stage logic cone of Mux/Lut cells according to an embodiment of the present invention.

FIG. 6D shows an example of a method for generating instruction table address for a token using a multi-stage logic cone 610, which has multiple stages 612 and each stage consists of several Multiplexer (Mux)/Lookup Table (Lut) cells 614 in parallel. The input bits of the first stage are all extracted control bits; the output bits of stage <i> become the input bits to the next stage <i+1>. The output bits of the last stage form the final addresses of M+2 instruction tables.

In some embodiments, each Mux/Lut cell contains n (for a non-limiting example, 6) multiplexers, which allow selection of 6 arbitrary bits from its input bits. The positions of these 6 selected bits per Mux/Lut cell are configurable by software. These 6 selected bits form a pointer to a 64-bit reconfigurable lookup table which in turn returns 1 bit output. As result, the design of each Mux/Lut 614 allows users to perform any logic expression on 6 arbitrary bits from its input bits.

Since the Mux/Lut Logic Cone 610 has multiple stages 612 and each stage contains several Mux/Lut cells 614 in parallel, it can be configured/programmed to perform several complex expressions and rules for checking the token 102 so that the lookup requests are generated appropriately in accordance with the network protocols the engine 100 is required to perform. For a non-limiting example, the Mux/Lut Logic Cone 610 may have have 3 to 5 stages 612s, and each stage 612 may have 32 to 64 Mux/Lut cells 614 except for the last stage, wherein the number of Mux/Lut cells 614 in the last stage is equal to the number of bits of all addresses pointing to M+2 instruction tables.

In some embodiments, the Mux/Lut Logic Cone 610 is highly flexible and scalable since it uses only standard Mux and Lut cells 614. In some embodiments, the Mux/Lut Logic Cone 610 can be reconfigured through hardware synthesis tools. For a non-limiting example, the open-source ABC synthesis tool from University of California at Berkeley can be used to configure the Mux/Lut Logic Cone 612 for supporting the matching comparisons defined by all current protocols.

Please note that any one of the four methods described in FIGS. 6A-6D above can be used to design the ITAG 306. Adopting one method over the other may depend upon on the trade-off between cost, flexibility and the support of software tools used to program the engine 100. The output from the ITAG 306 are M+2 addresses which are the pointers of M SuperKey Instruction Tables 308 and a ProfileID Instruction Table 310 as well as an EnVector Instruction Table 312.

FIG. 7A is an example of a block diagram of the Super-Key Instruction Table <i> (0<=i<M) and the content of each memory entry. All M SuperKey Instruction Tables 308 have the same size, but are programmed independently. Each entry of a SuperKey Instruction Table 308 contains K SuperKey instructions, which means that M SuperKey Instruction Tables 308 are configured to return M×K Super-Key instructions in total per input token 102. All these M×K returned instructions will be executed in parallel to build a lookup SuperKey 104.

FIG. 7B shows an example of the format of a SuperKey instruction, wherein the instruction includes one or more of the following fields:

1) En, which indicates whether the instruction is enabled to execute.
   If En==0x0, the instruction is not executed
   If En==0x1, the instruction is executed
2) IsConst, which indicates the instruction copy from a constant data or from an input source.
   If IsConst==0x0, the instruction will copy from an input source to a position in the SuperKey 104.
   If IsConst==0x1, the instruction will treat the BitMask field as a constant data, and copy that BitMask field to a position in the SuperKey 104.
3) Src_ID, which selects which source the data will be copied from in case that IsConst is 0x0. All input data sources used by the SuperKey instructions are listed by the example shown in FIG. 7C.
4) Src_ByteOffset, which indicates the first byte position in the selected source data, from there the data will be copied from.
5) Length, which shows how many bytes are needed to copy from the selected source data, counted from the Src_ByteOffset. In the case that IsConst is 0x1, the Length field tells how many constant bits from the BitMask field will be copied.
6) BitMask, which masks bits in copied bytes so that the instruction can copy individual bits rather than the whole bytes. In the case that IsConst is 0x1, the BitMask field becomes the constant data for the instruction.

7) Dst_ByteOffset, which indicates the first byte position in the SuperKey 104 where the copied data will be pasted to.

Assuming a token 102 has N layers in the Layers portion 404, as listed in FIG. 7C, a SuperKey instruction can copy data from one of: any layer in N layers, the Common portion 402 of the token 102, and the Template Metadata of the token 102.

Figure 8A:
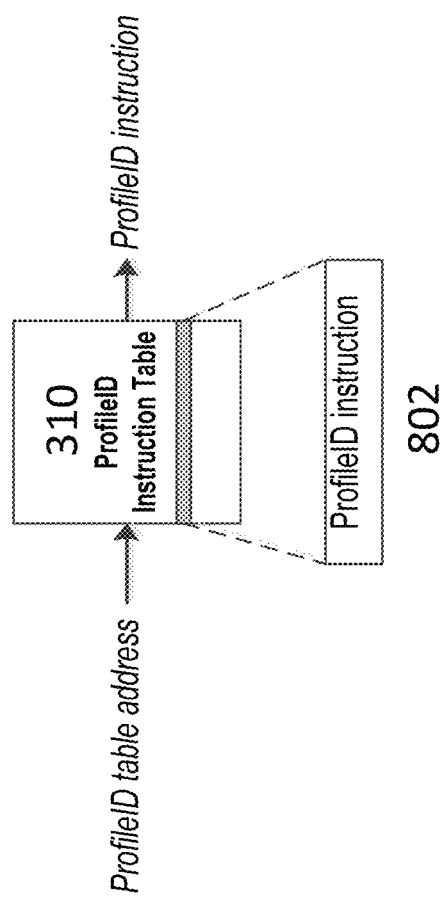
FIG. 8A is an example of a block diagram of the ProfileID Table and the content of each memory entry according to an embodiment of the present invention.
Figure 8B:
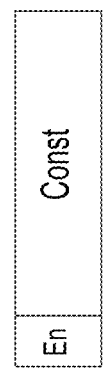
FIG. 8B shows an example of the format of a ProfileID instruction according to an embodiment of the present invention.

In parallel with building the SuperKey 104, the network lookup engine 100 is also configured to create and store instructions for generating a ProfileID 106 into a ProfileID Instruction Table 310 as shown in the example depicted in FIG. 8A. Each entry of the ProfileID Instruction Table 310 contains only one ProfileID instruction 802. An example of the format of the ProfileID instruction 802 is shown in FIG. 8B, which includes at least two fields:

1) En, indicates whether the instruction 802 is enabled to be executed. If the instruction is not executed, the output ProfileID 106 gets the default value, e.g., 0x0.

2) Const, which is the constant value to be set for the ProfileID 106 if En is 0x1.

Figure 9A:
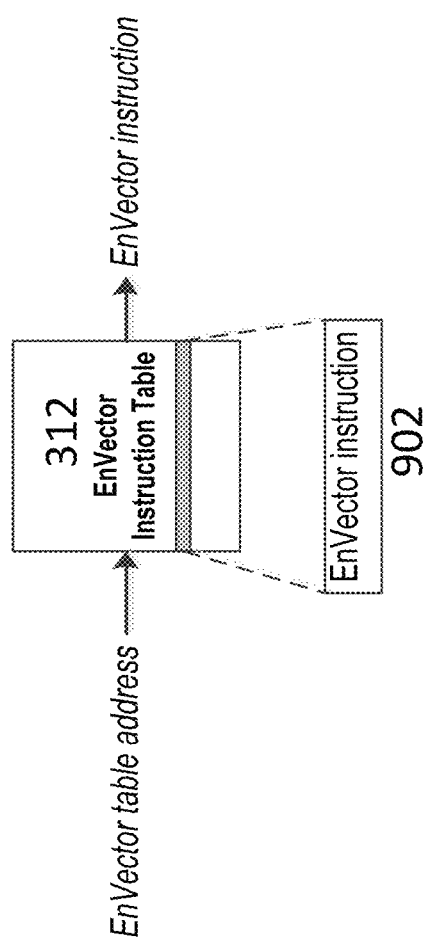
FIG. 9A is an example of a block diagram of the EnVector Table and the content of each memory entry according to an embodiment of the present invention.
Figure 9B:
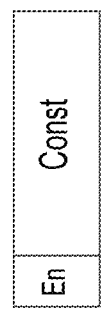
FIG. 9B shows an example of the format of a EnVector instruction according to an embodiment of the present invention.

In some embodiments, the network lookup engine 100 is also configured to create and store instructions for generating an EnVector 108 into a EnVector Instruction Table 312 as shown in the example depicted in FIG. 9A. Each entry of the EnVector Instruction Table 312 contains only one EnVector instruction 902. An example of the format of an EnVector instruction 902 is shown in FIG. 9B, which includes at least two fields:

1) En, which indicates whether the instruction is enabled to be executed. If the instruction is not executed, the output EnVector gets the default value, e.g., 0x0.

2) Const, which is the constant value to be set for the EnVector 108 if En is 0x1.

In the example of FIG. 3, instructions from the instruction tables are sent to their respective hardware logic blocks 314, 316, and 318, which execute all these instructions in parallel per input token 102. There are K×M logic blocks 314s for executing K×M SuperKey instructions, one logic block 316 for executing the ProfileID instruction, and one logic block 318 for executing the EnVector instruction.

Figure 10A:
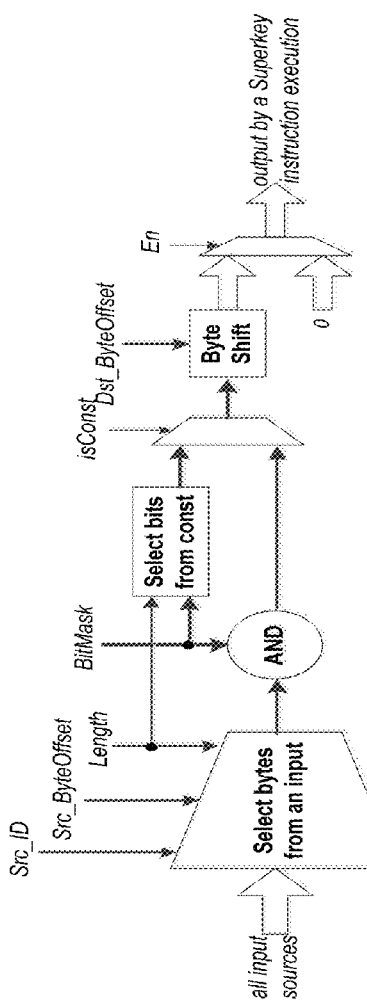
FIG. 10A is an example of a block diagram illustrating the hardware logic for executing a SuperKey instruction according to an embodiment of the present invention.
Figure 10B:
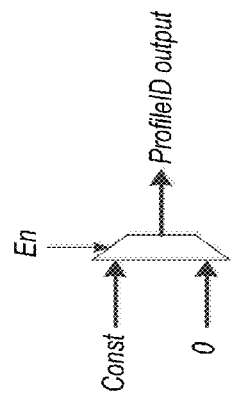
FIG. 10B is an example of a block diagram illustrating the hardware logic for executing a ProfileID instruction according to an embodiment of the present invention.
Figure 10C:
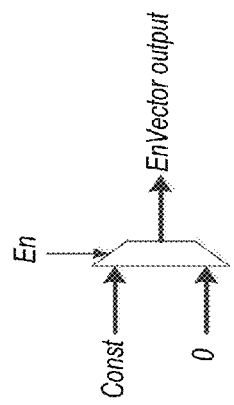
FIG. 10C is an example of a block diagram illustrating the hardware logic for executing a EnVector instruction according to an embodiment of the present invention.

The hardware logic block 314 for executing a SuperKey instruction is shown by the example in FIG. 10A, wherein each SuperKey instruction copies data from a source as listed in FIG. 7C or from a constant data. The copied data is pasted to a position in the SuperKey 104. All K×M SuperKey instructions are executed in parallel to build the final SuperKey 104. Before executing the SuperKey instructions, the SuperKey is first initialized to be 0x0. The hardware logic blocks for executing the ProfileID instruction and the EnVector instruction are shown in FIG. 10B and FIG. 10C, respectively. The hardware logic of each block copies either a constant data or 0x0 to the output.

Figure 11:
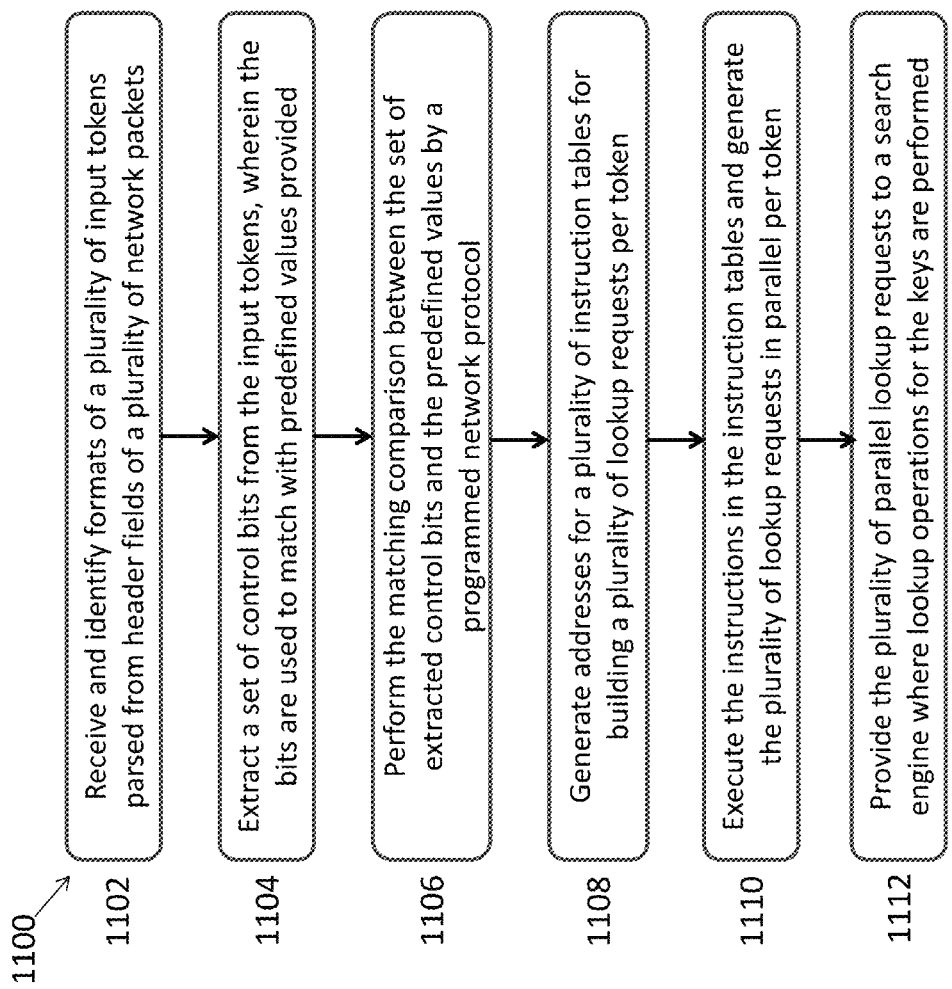
FIG. 11 depicts a flowchart of an example showing steps for generating multiple lookup requests in parallel per packet in a software-defined network (SDN) according to an embodiment of the present invention.

FIG. 11 depicts a flowchart of an example showing steps for generating multiple lookup requests in parallel per packet in a software-defined network (SDN) according to an embodiment of the present invention. Although the figure depicts functional steps in a particular order for purposes of illustration, the processes are not limited to any particular order or arrangement of steps. One skilled in the relevant art will appreciate that the various steps portrayed in this figure could be omitted, rearranged, combined and/or adapted in various ways.

In the example of FIG. 11, the flowchart 1100 starts at block 1102, where formats of a plurality of input tokens parsed from header fields of a plurality of network packets are identified. The flowchart 1100 continues to block 1104, where a set of control bits are extracted from each of the input tokens, wherein the set of extracted bits are used to match with predefined values provided by a programmed network protocol. The flowchart 1100 continues to block 1106, where the matching comparison between the set of extracted control bits and the predefined values specified by the programmed network protocol is performed. The flowchart 1100 continues to block 1108, where addresses for a plurality of instruction tables are generated, wherein the instruction tables include instructions for building a plurality of lookup requests per each of the input tokens. The flowchart 1100 continues to block 1110, where the instructions in the instruction tables are executed and the plurality of lookup requests are generated in parallel per each of the input tokens. The flowchart 1100 ends at block 1112, where the plurality of parallel lookup requests are provided to a search engine where lookup operations for the keys are performed.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is therefore to understand that within the scope of the appended claims, the invention may be practiced otherwise than as specifically described herein. It is intended that the following claims and their equivalents define the scope of the invention.

We claim:

1. A processor configured as a programmable network lookup engine, the engine comprising:
   a template lookup table, executed by the processor, and configured to receive and identify formats of a plurality of input tokens parsed from header fields of a plurality of network packets; and
   a control data extractor, executed by the processor, and configured to extract a set of control bits from each of the input tokens, wherein the set of extracted bits are used to match with predefined values provided by a programmed network protocol;
   an instruction table address generator, executed by the processor, and configured to:
      perform the matching comparison between the set of extracted control bits and the predefined values by the programmed network protocol; and
      generate addresses for a plurality of instruction tables, wherein the instruction tables include instructions for building a plurality of lookup requests per each of the input tokens; and
   a plurality of instruction execution hardware logic blocks, executed by the processor, and configured to:
      execute the instructions in the instruction tables and generate the plurality of lookup requests in parallel per each of the input tokens, wherein each of the plurality of lookup requests is represented by a lookup key; and
      for each token, provide the plurality of parallel lookup keys to a search engine as a super key, where lookup operations for the lookup keys are performed using the super key, which represents contents of the plurality of parallel lookup keys for that token.

2. The engine of claim 1, wherein the super key for each token includes one or more of:
- a profile identification (ID), which includes information on one or more of: number of the lookup keys contained in the super key, positions of the lookup keys in the super key, and which lookup tables in the search engine will be used for each of the lookup keys; and
- an EnVector, which includes information indicating which of the lookup keys contained in the super key are valid.

3. The engine of claim 2, wherein using the profile ID to extract information of the lookup keys inside the super key allows the number of the lookup keys and/or the sizes of the lookup keys to vary token by token.

4. The engine of claim 1, wherein the engine is protocol-independent in which all blocks of the engine, except the execution hardware logic blocks, are programmable by software to support any network protocol.

5. The engine of claim 1, wherein the format of each of the input tokens includes a template identification (ID), which identifies number of layers, sizes of the layers, and positions of the layers inside the token.

6. The engine of claim 1, wherein said template lookup table is configured to extract metadata bits for each of the input tokens, wherein the metadata bits are additional control bits along with the control bits inside the corresponding token, which provide users more control information per token instead of embedding them inside the token itself.

7. The engine of claim 6, wherein said control data extractor is reconfigured by users to select the control bits at specific positions in the token and in the metadata, which are appropriate to the network protocols programmed for the engine.

8. The engine of claim 1, wherein said instruction table address generator is configured to perform the matching comparison among the extracted control bits and the predefined values accordingly to the network protocols supported by the engine.

9. The engine of claim 1, wherein said instruction table address generator is implemented using one of:
a) multiple Ternary Content-Addressable Memory (TCAM) modules with, one TCAM module per instruction table;
b) a unified TCAM and a combined memory containing addresses of the instruction tables;
c) D-LEFT based hash to derive addresses of the instruction tables from the extracted control bits;
d) a multi-stage Multiplexer (Mux)/Lookup Table (Lut) logic cone.

10. The engine of claim 9, wherein selecting the implementation of said instruction table address generator depends on the trade-off between cost, flexibility and support of software tools used to program the engine.

11. The engine of claim 9, wherein said multi-stage Mux/Lut logic cone includes a plurality of stages, wherein each stage includes a plurality of Mux/Lut cells.

12. The engine of claim 11, wherein the inputs to the first stage are the extracted control bits, the outputs of stage<i> are the inputs of stage<i+1>; and the outputs of the last stage form the addresses of the instruction tables.

13. The engine of claim 11, wherein each of the Mux/Lut cells in each of the stages includes a plurality of multiplexers and one lookup cell, which returns one bit output.

14. The engine of claim 2, wherein said instruction tables include a plurality of (M) super key instruction tables, one profile ID instruction table, and one EnVector instruction table.

15. The engine of claim 14, wherein each of said super key instruction tables includes a plurality of (K) programmable instructions for building the super key.

16. The engine of claim 15, wherein the M super key instruction tables provide M×K programmable instructions per token, wherein each instruction builds a portion of the super key and all M×K instructions are executed in parallel to build the complete super key.

17. The engine of claim 15, wherein each of the programmable instructions either copies data from a source or copies a constant value to a position in the super key.

18. The engine of claim 14, wherein said profile ID instruction table includes instructions for building the profile ID, wherein each table memory entry of the profile ID instruction table includes only one profile instruction.

19. The engine of claim 18, wherein the profile instruction either copies a constant value or retains the default value to the profile ID.

20. The engine of claim 14, wherein said EnVector instruction table includes instructions for building the EnVector, wherein each table memory entry of the EnVector instruction table includes only one EnVector instruction.

21. The engine of claim 20, wherein the EnVector instruction either copies a constant value or retains the default value to the EnVector.

22. The engine of claim 14, wherein said instruction execution hardware logic blocks include datapath to execute in parallel per token all of the instructions received from the plurality of super key instruction tables, and from the one profile ID instruction table as well as from the one EnVector instruction table.

23. A method for generating multiple lookup requests in parallel per packet in a software-defined network (SDN), the method being implemented on a processor and comprising:
- receiving and identifying formats of a plurality of input tokens parsed from header fields of a plurality of network packets;
- extracting a set of control bits from each of the input tokens, wherein the set of extracted bits are used to match with predefined values by a programmed network protocol;
- performing the matching comparison between the set of extracted control bits and the predefined values specified by the programmed network protocol;
- generating addresses for a plurality of instruction tables, wherein the instruction tables include instructions for building a plurality of lookup requests per each of the input tokens;
- executing the instructions in the instruction tables and generating the plurality of lookup requests in parallel per each of the input tokens, wherein each of the plurality of lookup requests is represented by a lookup key; and
- for each token, providing the plurality of parallel lookup keys to a search engine where lookup operations for the lookup keys are performed using a super key, which represents contents of the plurality of parallel lookup keys.

24. The method of claim 23, wherein the plurality of lookup requests per token includes one or more of:

a profile identification (ID), which includes information on one or more of: number of the lookup keys contained in the super key, positions of the lookup keys in the super key, and which lookup tables in the search engine will be used for each of the lookup keys; and an EnVector, which includes information indicating which of the lookup keys contained in the super key are valid.

25. The method of claim 24, further comprising:
using the profile ID to extract information of the lookup keys inside the super key to allow the number of the lookup keys and/or the sizes of the lookup keys to vary token by token.

26. The method of claim 23, further comprising:
identifying number of layers, sizes of the layers, and positions of the layers inside each of the input tokens.

27. The method of claim 23, further comprising:
extracting metadata bits for each of the input tokens, wherein the metadata bits are additional control bits along with the control bits inside the corresponding token, which provide users more control information per token instead of embedding them inside the token itself.

28. The method of claim 27, further comprising:
selecting the control bits at specific positions in the token and in the metadata, which are appropriate to the programmed network protocols.

29. The method of claim 23, further comprising generating the addresses for the plurality of instruction tables using one of:
  a) multiple Ternary Content-Addressable Memory (TCAM) modules with, one TCAM module per instruction table;
  b) a unified TCAM and a combined memory containing addresses of the instruction tables;
  c) D-LEFT based hash to derive addresses of the instruction tables from the extracted control bits;
  d) a multi-stage Multiplexer (Mux)/Lookup Table (Lut) logic cone.

30. The method of claim 29, wherein said multi-stage Mux/Lut logic cone includes a plurality of stages, wherein each stage includes a plurality of Mux/Lut cells.

31. The method of claim 29, wherein each of the Mux/Lut cells in each of the stages includes a plurality of multiplexers and one lookup cell, which returns an one bit output.

* * * * *